United States Patent [19]

Jansson

[11] Patent Number: 5,013,941
[45] Date of Patent: May 7, 1991

[54] TTL TO ECL/CML TRANSLATOR CIRCUIT
[75] Inventor: Lars G. Jansson, Long Island, Me.
[73] Assignee: National Semiconductor Corporation, Santa Clara, Calif.
[21] Appl. No.: 395,259
[22] Filed: Aug. 17, 1989
[51] Int. Cl.[5] .............................................. H03K 19/08
[52] U.S. Cl. .................................. 307/475; 307/310; 307/455; 307/544; 307/443
[58] Field of Search ............... 307/475, 310, 455, 544, 307/443

[56] References Cited

U.S. PATENT DOCUMENTS

| | | | |
|---|---|---|---|
| 3,758,791 | 9/1973 | Taniguchi et al. | 307/310 |
| 3,806,736 | 4/1974 | Wilhelm | 307/443 |
| 3,946,246 | 3/1976 | Marley | 307/443 |
| 4,329,597 | 5/1982 | Yamagiwa | 307/310 |
| 4,533,842 | 8/1985 | Yang et al. | 307/475 |
| 4,607,177 | 8/1986 | Lechner | 307/475 |
| 4,654,549 | 3/1987 | Hannington | 307/475 |
| 4,736,125 | 4/1988 | Yuen | 307/475 |
| 4,745,304 | 5/1988 | Wilson | 307/455 |
| 4,771,191 | 9/1988 | Estrada | 307/475 |

Primary Examiner—Stanley D. Miller
Assistant Examiner—Scott A. Ouellette
Attorney, Agent, or Firm—Lee Patch; Daniel Kane

[57] ABSTRACT

A translator-translator logic (TTL) to emitter coupled logic or current mode logic (ECL/CML) input buffer and translator circuit provides temperature compensated input and threshold signal voltage levels to a translator circuit ECL gate for improved operation of the translator circuit. A threshold clamp circuit is coupled between an on-chip band-gap bias generator and the base node of the reference transistor element of the translator circuit ECL gate. The threshold clamp circuit maintains a substantially fixed temperature compensated reference voltage or threshold voltage level at the base node of the reference transistor element, referenced to the temperature compensated current source voltage level $V_{cs}$ from the bias generator. An input clamp circuit also references the logic high signal voltage level $V_{TH}$ at the base node of the ECL gate input transistor element to $V_{CS}$.

19 Claims, 3 Drawing Sheets

TTL TO ECL/CML TRANSLATOR CIRCUIT

Technical Field

This invention relates to a new transistor-transistor logic (TTL) to emitter coupled logic or current mode logic (ECL/CML) input buffer and translator circuit for translating TTL logic high and low potential signals at the input to current mode logic signals at the output for processing by emitter coupled logic integrated circuits. The invention is particularly applicable to single +5.0v rail ECL integrated circuits having an on-chip band-gap bias generator which generates temperature compensated voltage supplies for the internal ECL gates of the integrated circuit. The invention provides temperature compensated input and threshold signal voltage levels to the translator circuit ECL gate for improved operation of the translator circuit.

BACKGROUND ART

Figure 1:
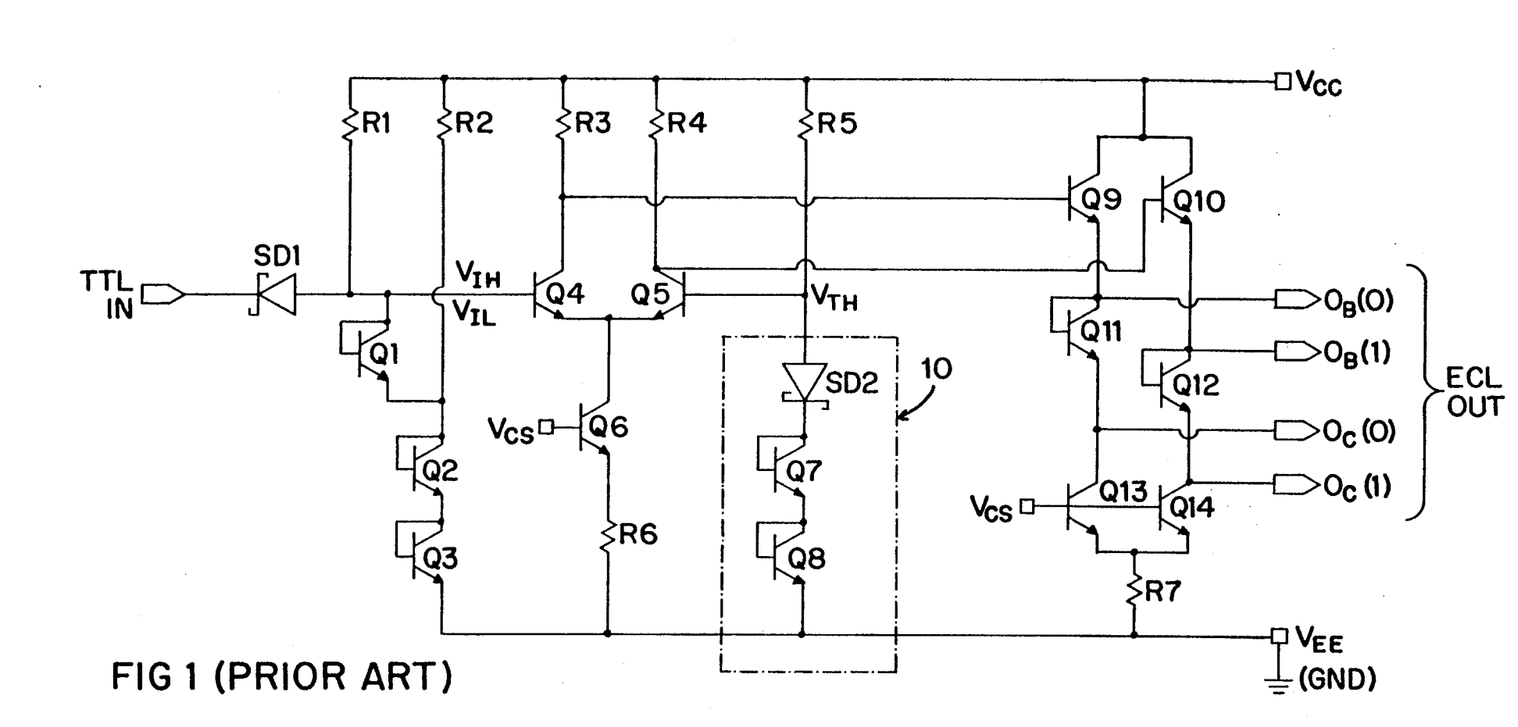
FIG. 1 is a schematic circuit diagram of a prior art TTL to ECL/CML translator circuit and FIG. 1A shows a corresponding band gap bias generator on the same chip.
Figure 1A:
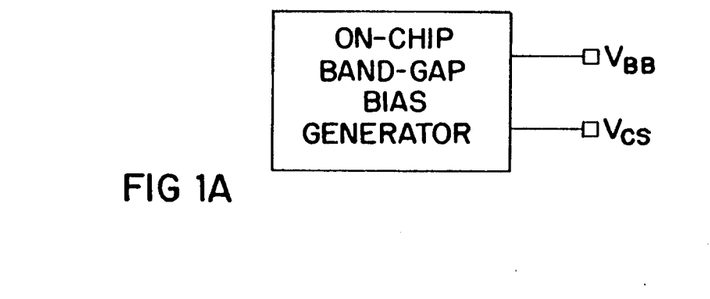

A conventional prior art TTL to ECL/CML input buffer and translator circuit is illustrated in FIG. 1. The translator circuit incorporates an ECL gate, also referred to herein as an ECL base differential gate, coupled between the high potential power rail $V_{CC}$ and the low potential power rail $V_{EE}$. In this example the high potential power rail $V_{CC}$ may be at, for example, 4.5 or 5.0 volts while the low potential power rail $V_{EE}$ may be at 0 volts or ground potential (GND).

The ECL gate is a base differential gate with an input transistor Q4 for receiving input signals of logic high and low potential levels at its base node, and a reference transistor element Q5. A threshold signal voltage level between the logic high and low potential input signal levels is applied at the base node of the reference transistor element Q5. The emitter terminals of ECL gate transistors Q4 and Q5 are coupled together at a common emitter node coupling. A current sink provided by emitter follower current source transistor element Q6 and emitter or tail resistor R6 is coupled between the common emitter node coupling of ECL gate transistors Q4 and Q5 and the low potential power rail $V_{EE}$. With the current source voltage $V_{CS}$ applied at the base node of current source transistor element Q6, the current sink generates the sink current or tail current through either of the alternative current paths provided by the ECL gate transistor elements Q4 and Q5. A band-gap bias generator, not shown, but available as a part of a larger ECL integrated circuit, generates the temperature compensated current source voltage level $V_{CS}$.

The base node of input transistor element Q4 is coupled through input diode SD1, in this example a Schottky diode, to the TTL input, TTL IN. The TTL input receives TTL signals of typical TTL logic high and low potential levels, for example between a high of +5.0 v and a low of 0 v or ground potential. The input clamp circuit applies controlled logic high and low signal potential levels $V_{TM}$, $V_{TL}$ at the base node of the input transistor element Q4.

The input clamp circuit is a diode stack provided by base collector shorted (BCS) transistor elements Q1, Q2 and Q3 coupled in series between the base node of input transistor element Q4 and the low potential power rail $V_{EE}$. Collector resistor R2 is a biasing resistor or current sourcing resistor which forward biases BCS transistor element diodes Q2 and Q3 with current passing through R2, Q2 and Q3 from $V_{CC}$ to $V_{EE}$. With a TTL logic high potential level signal of for example 4.5 or 5.0 volts at the TTL input, current passes from $V_{CC}$ through current sourcing resistor element R1 and forward biases BCS transistor element diode Q1 at the top of the diode stack. The input clamp circuit diode stack is then operative to apply the selected logic high signal potential level $V_{TM}$ in the range of for example, approximately 2.2 v to 2.4 v at the base node of input transistor element Q4. When a TTL logic low potential level of for example 0 v or ground potential $V_{EE}$ is applied at the TTL input, current from $V_{CC}$ through current sourcing resistor element R1 is diverted through the input diode SD1 to ground potential. The input diode SD1 applies or clamps the selected logic low signal potential level $V_{TL}$, in the range of for example 0.6 v to 0.8 v at the base node of input transistor element Q4.

As alternating logic high and low signal levels $V_{TM}$, $V_{TL}$ are applied at the base node of input transistor element Q4, a single reference voltage or threshold voltage $V_{TM}$ is applied at the base node of reference transistor element Q5. In the conventional TTL to ECL/CML translator circuit of FIG. 1, the threshold voltage $V_{TM}$, sometimes referred to as $V_{IN\ REF}$, is established by a threshold clamp circuit, typically a diode stack. The diode stack in this example is provided by BCS transistor element diodes Q8 and Q7, and diode SD2 coupled in series between the base node of reference transistor element Q5 and the low potential power rail $V_{EE}$. In this case diode SD2 is a Schottky diode intended to match and offset the characteristics of the input diode SD1.

The diode stack SD2, Q7 and Q8 is forward biased by current passing through the diodes from biasing resistor or current sourcing resistor R5 coupled between the base node of reference transistor element Q5 and the high potential power rail $V_{CC}$. The threshold clamp circuit components are selected to apply a threshold voltage level $V_{TM}$ at the base node of the reference transistor element Q5 of for example 1.4 v or 1.5 v, substantially intermediate between the logic high and low signal levels $V_{TH}$, $V_{IT}$, applied at the base node of input transistor element Q4.

The ECL differential gate transistor elements Q4 and Q5 provide alternative current paths through respective collector path swing voltage resistor elements R3 and R4 which are in turn coupled to the high potential power rail $V_{CC}$. Typically the swing voltage resistor elements R3 and R4 have substantially equal resistance. The current sink provided by current sourcing transistor element Q6 and tail resistor R6 generates the ECL gate current in one of the alternative current paths through either of the swing resistor elements R3 or R4 according to the logic high or low signal potential level $V_{TH}$, $V_{TL}$ at the base node of input transistor element Q4.

The ECL base differential gate output signals are taken from the collector nodes of the ECL gate transistor elements Q4 and Q5. The collector nodes of Q4 and Q5 are output switching nodes which provide current mode logic output signals of high and low potential through respective output buffer emitter follower transistor elements Q9 and Q10 to the ECL output ECL OUT. Two sets of complementary outputs are provided at the ECL output. The first set of complementary outputs $O_B(0)$ (false or inverting), $C_B(1)$ (true or non-inverting) is taken respectively from the emitter nodes of the emitter follower output buffer transistor elements Q9 and Q10. The second set of complementary outputs is level shifted down by a set of BCS transistor element diodes Q11 and Q12 coupled in series respectively to the emitter nodes of the emitter follower output buffer transistor elements Q9 and Q10. The second set of complementary outputs $O_c(0)$, $O_c(1)$ is taken from the emitter nodes of BCS transistor elements Q11 and Q12.

A double current sink provided by current source transistor elements Q13, Q14 and common emitter node tail resistor R7 forward biases the emitter follower output buffer transistor elements Q9 and Q10 respectively and level shifting diodes Q11 and Q12 respectively for providing the ECL output signals. The temperature compensated current source voltage level $V_{CS}$ generated by the on-chip band-gap bias generator is applied at the base nodes of the current source transistor elements Q13 and Q14 for generating the sink current or tail current through the respective output transistor elements.

A characteristic of stable ECL gate operation is that the voltage levels or potentials at the base nodes of the ECL differential gate transistor elements are referenced to the same power rail. In conventional ECL integrated circuits the ECL logic high and low potential levels are referenced to the high potential power rail. The voltage levels or potential levels at the base nodes of the internal ECL gate transistor elements are therefore referenced to the high potential power rail.

TTL logic high and low potential levels however are referenced to the low potential power rail or ground rail. In the case of a TTL to ECL/CML translator circuit, the TTL input signals to the input transistor element of the translator circuit ECL gate are referenced to the low potential power rail. The input clamp circuit provided by BCS transistor elements Q1, Q2 and Q3 and the input diode SD1 set the voltage levels of the logic high and low signal potential levels $V_{TH}$, $V_{TL}$ with reference to the ground rail $V_{EE}$. The threshold clamp circuit diode stack SD2, Q7 and Q8 therefore also sets the intermediate reference voltage level or threshold voltage level $V_{TM}$ with reference to the ground rail $V_{EE}$.

In conventional ECL integrated circuits the bandgap bias generator generates the reference voltage levels for the internal ECL gates. Thus in addition to providing the temperature compensated current source voltage level $V_{CS}$ for operating the current sinks and current source transistor elements of the internal ECL circuits, it also generates the threshold voltage level, generally designated $V_{BB}$ applied to the base nodes of the reference transistor elements of each of the internal ECL gates. The reference voltage level or threshold voltage level $V_{BB}$ generated by the band-gap bias generator is however established with reference to the high potential power rail and therefore cannot be applied to the base node of the reference transistor element of the translator circuit ECL gate. It is for this reason that a separate threshold clamp circuit is provided as illustrated in FIG. 1 to establish the threshold voltage level $V_{TH}$ with reference to the low potential or ground potential power rail. In this manner the voltage levels at the base nodes of the input and reference transistor elements of the translator circuit ECL gate can follow each other with variations in the ground potential power rail $V_{EE}$.

A problem presented by this conventional TTL to ECL/CML translator circuit structure however is that the threshold voltage level, $V_{TH}$ or $V_{TM\ REF}$ is no longer temperature compensated. The circuit is therefore vulnerable to the disadvantages which are caused by variation in the threshold voltage level value applied at the base node of the reference transistor element with variations in the operating temperature, process variations, and $V_{CC}$ power rail variations.

Variation in the threshold voltage level $V_{TH}$ as a result of the conventional threshold clamp circuit diode stack illustrated in FIG. 1 may be analyzed as follows. The voltage drop $V_{BE}$, also designated $\phi$, across the base/emitter junction of a bipolar transistor element is approximately 0.7v or 0.8v with a negative temperature coefficient or tempco of $-1.6$ mV/° C. As a result of the negative temperature coefficient, the voltage drop across the base to emitter junctions of the BS transistor element diodes Q7 and Q8 decreases with increasing temperature. The typical voltage drop across the Schottky diode SD2 is 0.6v with a temperature coefficient or tempco of $-1.4$ mV/° C. Again because of the negative temperature coefficient, the voltage drop across the Schottky diode decreases with increasing temperature. As a result of the cumulative fluctuations of the threshold clamp circuit with temperature, the threshold voltage level $V_{TH}$ with a value of 1.4v at room temperature may vary from 0.9v to 1.9v over temperature operating range specifications from $-55°$ C. to 125° C. At least three disadvantages follow upon such a wide variation of the threshold voltage.

Figure 2:
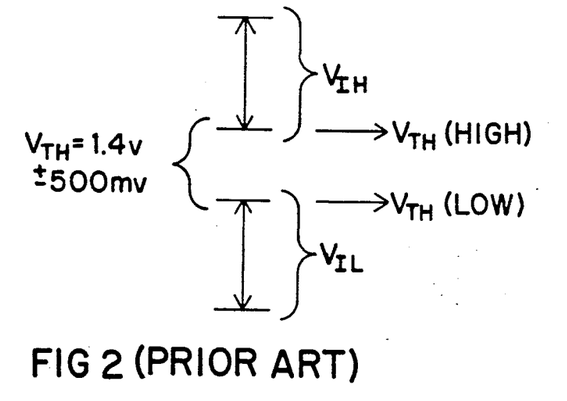
FIG. 2 is a simplified graph illustrating the narrow noise margins characteristic of the translator circuit of FIG. 1.

First as illustrated in FIG. 2, the wide variation in threshold voltage leaves only narrow noise margins in the range of for example, 300 mV to 500 mV for possible variations in the logic high and low signal potential levels $V_{TH}$, $V_{TL}$ at the base node of the input transistor element. Variation of the input signals in excess of the narrow noise margins may cause false switching of the translator circuit ECL gate and false signals at the ECL output.

Second, the wide range of variation in the threshold voltage causes variation and inconsistency in the speed of transition of the translator circuit between the high and low potential levels. In particular there is increased skew or hysteresis in the propagation delay or time of propagation between the high to low propagation time tpHL and the propagation time for low to high transition tpLH. Undesirable skew is the time difference between tpLH and tpHL. The time of propagation is measured for example at the 1.5v crossover point and is the delay time between the 1.5v crossover point at the base node of the input transistor element of the translator circuit ECL gate and the 1.5v crossover point at the ECL output ECL OUT. In the case of the TTL to ECL/CML translator circuit, the crossover point is taken to be the threshold voltage level and the threshold voltage level variations therefore translate to variations in the propagation delay and increased skew.

Finally, variation in the threshold voltage level causes increased sensitivity to internal ground bounce. Because of the small noise margin a relatively small negative internal ground bounce may cause false data signals to occur, false clocking, or other glitches.

Objects of the Invention

It is therefore an object of the present invention to provide an improved TTL to ECL/CML translator circuit having a substantially constant and fixed reference voltage or threshold voltage level over the desired operating temperature range applied to the base node of the reference transistor element of the translator circuit ECL gate. In particular, it is an object of the invention to provide a temperature compensated threshold voltage level which is referenced to the low potential power rail.

Another object of the invention is to provide a threshold voltage clamp circuit that is referenced to a temperature compensated current source voltage supply, available for example from an on-chip band-gap bias generator, which temperature compensated voltage supply is in turn referenced to the low potential power rail.

A further object of the invention is to provide a new TTL to ECL/CML translator circuit with improved noise margins at the logic high and low signal input potential levels $V_{TH}$, $V_{TL}$ for tolerating greater noise amplitude without generating false signals; with reduced skew or hysteresis between the propagation time or propagation delay for greater consistency of tpHL and tpLH over the operating temperature range; and with reduced sensitivity to ground bounce or increased toleration of ground bounce without glitches on the data pins or clock pins. The reduced skew according to the invention also achieves the object of an overall speed improvement of 40% across the operating temperature range and $V_{CC}$ range.

Disclosure of the Invention

In order to accomplish these results the present invention provides a threshold clamp circuit that is operatively coupled between an on-chip band-gap bias generator and the base node of the reference transistor element of a translator circuit ECL gate. The threshold clamp circuit is constructed and arranged for applying a temperature compensated threshold signal voltage level $V_{TH}$, referenced to the temperature compensated current source voltage level $V_{CS}$ from the bias generator, at the base node of the reference transistor element.

A feature and advantage of this arrangement is that the temperature compensated current source voltage level $V_{CS}$ generated by the band-gap bias generator is conventionally referenced to the low potential power rail $V_{EE}$. As a result the voltage levels applied at the respective base nodes of the input and reference transistor elements of the translator circuit ECL gate are both referenced to the same low potential power rail or ground potential.

More generally the invention provides a translator circuit having at least one current sink with a first current source transistor element, first tail resistor element, and a temperature compensated current source voltage supply however derived, which supplies a temperature compensated current source voltage level $V_{CS}$, referenced to the low potential power rail $V_{EE}$. The temperature compensated current source voltage level $V_{CS}$ is supplied at the base node of the first current source transistor element.

According to the invention the threshold clamp circuit comprises an emitter follower second current source transistor element and second tail resistor element. The base node of the second current source transistor element is coupled to the temperature compensated current source voltage level $V_{CS}$. A first voltage level shifting circuit is coupled between the emitter node of the second current source transistor element and the base node of the reference transistor element. By this arrangement the threshold clamp circuit is operatively coupled between the temperature compensated current source voltage supply and the base node of the reference transistor element for applying a temperature compensated threshold voltage signal level $V_{TH}$, referenced to the temperature compensated current source voltage level $V_{CS}$. The temperature compensated threshold voltage level $V_{TH}$ applied at the base node of the reference transistor element is therefore ultimately referenced to the low potential power rail or ground rail.

The components of the threshold clamp circuit are selected so that the threshold signal voltage level $V_{TH}$ is substantially centered between the logic high and low signal potential levels $V_{TH}$, $T_{TL}$ at the base node of the input transistor element. In the preferred example embodiment, the voltage level shifting components of the threshold clamp circuit substantially cancel so that the temperature compensated current source voltage level $V_{CS}$ is applied substantially as the threshold voltage level $V_{TH}$ at the base node of the reference transistor element.

For example, the first voltage level shifting circuit of the threshold clamp circuit may be a diode stack circuit having components selected and oriented for substantially compensating and cancelling non-zero temperature coefficient effects on the operation of the ECL base differential gate over a selected operating temperature range. In the preferred example embodiment, the diode stack comprises a BCS transistor element and a Schottky diode transistor element coupled in series. An advantage of this arrangement is that the base to emitter voltage drop $+V_{BE}$ across the diode stack BCS transistor element diode may be selected to substantially compensate and cancel the oppositely directed base to emitter junction voltage drop $-V_{BE}$ across the second current source transistor element. Similarly the Schottky diode of the first voltage level shifting circuit diode stack substantially compensates and cancels the voltage drop effect across the input Schottky diode at the base node of the input transistor element. As a result the temperature compensated current sourcing voltage level $V_{CS}$ is applied at the base node of the threshold transistor element.

In the preferred example embodiment a current sourcing resistor element couples the threshold clamp circuit and the base node of the reference transistor element to the relatively high potential power rail $V_{CC}$. The current sourcing resistor element and the components of the threshold clamp circuit are selected so that the current from the emitter of the threshold clamp circuit second current sourcing transistor element is substantially greater than the current through the current sourcing resistor element and diode stack. For example the current generated by the threshold clamp circuit second current source transistor element may be a factor of 10 greater than the current through the current sourcing resistor element and diode stack. A feature and advantage of this arrangement is that the second current source transistor element of the threshold clamp circuit is able to maintain a stable voltage at its emitter node despite variations in $V_{CC}$ and the current through the diode stack for applying the temperature compensated current source voltage level $V_{CS}$ through the diode stack to the base node of the reference transistor element.

The invention also contemplates a number of variations for the threshold clamp circuit. For example a resistor may be added in series in the diode stack to increase the number of controllable degrees of freedom or parameters of the threshold clamp circuit. Similarly, the emitter areas of the threshold clamp circuit second current source transistor element and the diode stack BCS transistor element may selectively differ for introducing selected non-zero temperature coefficients in the threshold clamp circuit according to the circuit application. The diode areas of the threshold clamp circuit diode stack Schottky diode may also differ from the input Schottky diode to introduce further non-zero temperature coefficient effects. For example, a slightly positive temperature coefficient may be introduced to compensate for greater negative temperature coefficients introduced by base emitter junctions of the circuit. Alternatively, if the temperature compensated current source voltage level $V_{CS}$ is derived from a band-gap bias generator, the bias generator may be programmed to deliver a $V_{CS}$ with slightly positive temperature coefficient to further compensate for the negative temperature coefficients of translator circuit $V_{BE}$'s.

In order to provide an input clamp circuit which "tracks" or follows the characteristics of the threshold clamp circuit, the invention provides an input clamp circuit operatively coupled between the temperature compensated current source voltage supply and the base node of the input transistor element. The input clamp circuit applies a temperature compensated logic high signal potential level $V_{TH}$, referenced to the temperature compensated current source voltage level $V_{CS}$, at the base node of the input transistor element. The input clamp circuit comprises a third current source transistor element and third tail resistor element coupled to the low potential power rail $V_{EE}$. The base node of the third current source transistor element is coupled to the temperature compensated current source voltage level $V_{CS}$. The input clamp circuit includes a second voltage level shifting circuit coupled between the emitter node of the third current source transistor element and the base node of the input transistor element.

The second voltage level shifting circuit of the input clamp circuit is, for example, similarly a diode stack with voltage level shift components and oriented for substantially compensating and cancelling non-zero temperature coefficient effects. For example, the second voltage level shifting circuit diode stack of the input clamp circuit may comprise a pair of BCS transistor element diodes coupled in series between the emitter node of the third current source transistor element and the base node of the input transistor element.

According to the preferred example the first and second level shifting circuits of the respective threshold and input clamp circuits comprise components selected and arranged to maintain a substantially constant base node voltage differential $V_{TH}-V_{TH}$ between the base nodes of the input and reference transistor elements when a logic high signal potential level $V_{TH}$ is applied at the base node of the input transistor element. This base differential $V_{TH}-V_{TH}$ is preferably at least approximately three times the band-gap voltage $V_T$ of the semiconductor material and is maintained over the operating temperature range. The band-gap voltage $V_T$ is defined as:

$$V_T = kT/Q$$

where Q is the electronic charge, T the temperature, and k is Boltzmann's constant. The band-gap voltage at room temperature for silicon for example is approximately 26mV. The components of the respective diode stack circuits of the input and threshold clamp circuits are also selected and arranged for substantially compensating and cancelling non-zero temperature coefficient effects introduced by the respective components on the operation of the translator circuit ECL gate over the selected operating temperature range.

In an alternative embodiment, the threshold clamp circuit uses an emitter follower current source transistor element of the output current sink coupled between the output buffer emitter follower transistor elements and the low potential power rail. The first level shifting circuit, e.g. the diode stack is coupled between the emitter node of the output current source transistor element and the base node of the threshold transistor element. An additional current source transistor element, i.e. the second current source transistor element, is therefore not necessary.

Other objects, features and advantages of the invention are set forth in the following specification and accompanying drawings.

Description of Preferred Example Embodiments and Best Mode of the Invention

Figure 3:
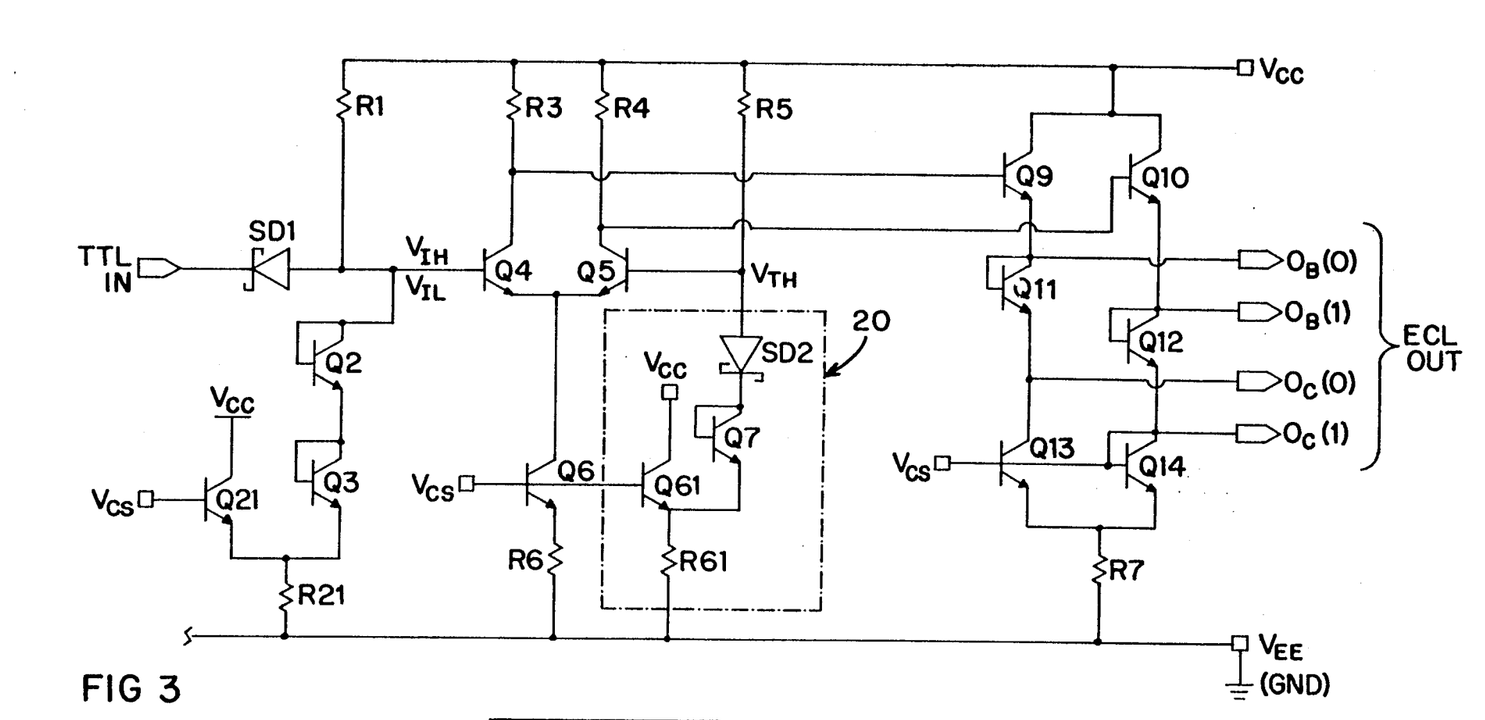
FIG. 3 is a schematic circuit diagram of the TTL to ECL/CML translator circuit of the invention and FIG. 3A shows a corresponding band gap bias generator on the same chip.
Figure 3A:
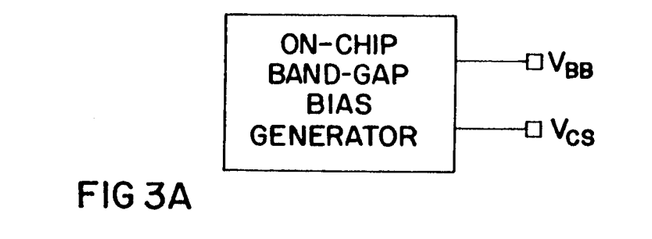

A TTL to ECL/CML translator circuit according to the invention is illustrated in FIG. 3. The circuit components of FIG. 3 performing the same or similar functions as those described in FIG. 1 are indicated by the same reference numbers or designations. The conventional threshold clamp circuit 10 of FIG. 1 however has been replaced by the temperature compensating threshold clamp circuit 20 of FIG. 3.

The temperature compensating threshold clamp circuit 20 of FIG. 3 includes a second current source transistor element Q61 and second tail resistor element R61 coupled between the high and low potential power rails $V_{CC}$, $V_{EE}$. The second current source transistor element Q61 of the threshold clamp circuit 20 is an emitter follower current source transistor element. The base node o the second current source transistor element Q61 is coupled in parallel with the base node of the first current source transistor element Q6 for referencing the threshold clamp circuit 20 to the temperature compensated current source voltage level $V_{CS}$. The temperature compensated current source voltage level $V_{CS}$ is applied to the base node of the reference transistor element Q5 through the base to emitter junction of the second current source transistor element Q61 and a first level shifting or level up shift circuit coupled between the emitter node of transistor element Q61 and the base node of transistor element Q5.

The first level upshift circuit in this example is provided by a diode stack consisting of BCS transistor element Q7 and Schottky diode transistor element SD2 coupled in series between the emitter node of transistor element Q61 and the base node of transistor element Q5.

The components of the temperature compensating threshold clamp circuit 20 are selected so that the threshold level voltage $V_{TH}$ applied to the base node of reference transistor element Q5 is substantially the temperature compensated current source voltage level $V_{CS}$. The threshold voltage level $V_{TH}$ applied at the base node of reference transistor element Q5 relative to the logic high and low signal potential levels $V_{TH}$, $V_{TL}$ applied at the base node of the input transistor element Q4 can be analyzed with reference to the temperature compensated current source voltage level $V_{CS}$ as follows:

$$V_{TH} = V_{CS} - V_{BE}Q61 + V_{BE}Q7 + V_{SD2} - V_{SD1}$$

or $$V_{TH} = V_{CS} + \Delta V_{BE} + \Delta V_{SD}$$

where $$\Delta V_{BE} = V_{BE}Q7 - V_EQ61$$

and where $$\Delta V_{SD} = V_{SD2} - V_{SD1}$$

It is apparent that the components of the temperature compensating threshold clamp circuit 20 are selected and oriented to substantially compensate and cancel the non-zero temperature coefficient effects introduced individually by the separate components. In the example of FIG. 3 it is contemplated that the emitter areas of transistor elements Q61 and Q7 are substantially the same and that the junction diode areas of Schottky diodes SD1 and SD2 are also substantially the same. However the component areas may be selectively deigned so that $\Delta V_{BE}$ and or $\Delta V_{SD}$ are non-zero for selectively introducing non-zero temperature coefficient effects according to the circuit application. For example, the emitter areas of transistor elements Q61 and Q7 may selectively differ for the purpose of introducing a slightly positive temperature coefficient into the threshold clamp circuit in order to compensate and cancel slightly greater negative temperature coefficient effects introduced by the base to emitter voltage drop junctions $V_{BE}$'s of the circuit.

The temperature compensated current source voltage level $V_{CS}$ is preferably derived from an on-chip integrated circuit band-gap bias generator being used to provide temperature compensated voltage supplies for the internal ECL gates of the integrated circuit. A feature and advantage of this arrangement is that the current source voltage level $V_{CS}$ of conventional band-gap bias generators is referenced to the low potential power rail or ground rail. The voltage levels applied at the base nodes of both the input and reference transistor elements of the translator circuit ECL gate are therefore both referenced to the low potential power rail $V_{EE}$. The temperature coefficient of the current source voltage level $V_{CS}$ derived from conventional band-gap bias generators is programmable to provide a desired tempco. Typically for application in the present invention a temperature coefficient of 0 is selected. However the band-gap bias generator voltage level $V_{CS}$ may be programmed with a slightly positive tempco where appropriate to the circuit application for achieving the desired temperature compensation of the threshold voltage level $V_{TH}$.

The threshold clamp circuit 20 and base node of reference transistor element Q5 are coupled through current sourcing resistor element R5 to the high potential power rail $V_{CC}$. Current sourcing resistor element R5 is a large resistor, in the order of for example 20K ohms relative to the tail resistor R61, for example in the order of 2K ohms. The tail resistor R61 is a relatively small resistance for generating a relatively large tail current by emitter follower current source transistor element Q61 through the tail resistor element R61. The current $I_{R5}$ through resistor element R5 and the diode stack of the reference clamp circuit 20 is relatively smaller for example by approximately a factor of 10 than the emitter current $I_{Q61}$ from the emitter of the second current source transistor element Q61. The second emitter follower current source transistor element Q61 of the threshold clamp circuit 20 must generate a relatively large current in order to maintain a stable voltage level at its emitter node despite variations in the diode stack current $I_{R5}$ derived from the high potential rail $V_{CC}$. A stable voltage level may then be applied through the diode stack to the base node of the reference transistor element Q5. For this purpose the ratio of the emitter current from transistor element Q61 to the current through the diode stack $I_{R5}$ is approximately equal to or greater than 10:

$$I_{Q61}/I_{R6} \geq 10.$$

The input clamp circuit of FIG. 1 is provided by the BCS transistor element diode stack Q1, Q2 and Q3 coupled between the base node of the input transistor element and the low potential power rail $V_{EE}$. in place of the input clamp circuit of FIG. 1, the circuit of FIG. 3 according to the invention provides an input clamp circuit referenced to the temperature compensated current source voltage level $V_{CS}$. The input clamp circuit includes a third current source transistor element Q21 and third tail resistor element R21 coupled between the high and low potential power rails $V_{CC}$, $V_{EE}$. A second voltage level shifting circuit or upshift circuit is coupled between the emitter node of the third current source transistor element Q21 and the base node of the input transistor element Q4. The second voltage level shifting circuit in this example is a diode stack provided by BCS transistor element diodes Q2 and Q3 coupled in series between the emitter node of transistor element Q21 and the base node of transistor element Q4.

The first and second level shifting circuits provided by the diode stacks of the input clamp circuit and threshold clamp circuit respectively are selected and arranged to maintain a base voltage differential $V_{TM} - V_{TH}$ between the base nodes of the input and reference transistor elements when a logic high signal potential level $V_{TH}$ is applied at the base node of the input transistor element Q4. This base voltage differential $V_{TH} - V_{TH}$ is preferably selected to be at least approximately $3V_T$ where $V_T$ is the band-gap voltage of the semiconductor material, approximately 26mV at room temperature. A minimum differential of approximately 0.1v is required for switching the typical NPN bipolar transistor element and the present invention seeks to maintain a minimum base voltage differential of about 120mV 0.12v), approximately equal to 3 $V_T$ across all conditions.

In setting and selecting voltage levels according to the invention, the threshold voltage $V_{TH}$ is preferably centered between logic high and low signal potential levels $V_{TH}$, $V_{TL}$. With $V_{TH}$ and $V_{TL}$ of approximately for example 0.8v and 2.0v respectively, $V_{TH}$ is set at approximately 1.4v or 1.5v. This is also the standard temperature compensated current source voltage level $V_{CS}$ available from the standard band-gap bias generator.

Figure 4:
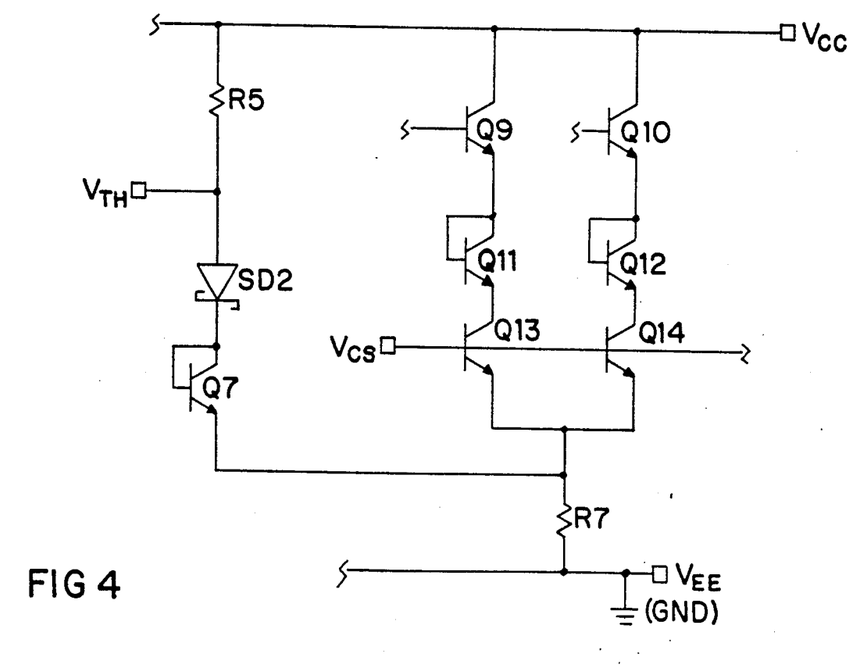
FIG. 4 is a detailed fragmentary schematic circuit diagram of an alternative embodiment of the translator circuit.

The temperature compensated current source voltage level $V_{CS}$ applied at the respective input and threshold clamp circuits may be derived from the current source transistor element of any of the current sinks of the translator circuit or other portions of the integrated circuit. In the example of FIG. 3 the current source voltage level $V_{CS}$ for the threshold clamp circuit 20 is derived from the base node of the current source transistor element Q6 of the current sink for the translator circuit ECL gate composed of transistor elements Q4 and Q5. Alternatively, the current source voltage level $V_{CS}$ may be derived from the base nodes of output current source transistor elements Q13, Q14, part of the double current sink for the output buffer emitter follower transistor elements Q9 and Q10, as illustrated in FIG. 4. An additional emitter follower current sink transistor element is not required because output current source transistor elements Q13 and Q14 are themselves emitter followers operating through output buffer emitter follower transistor elements Q9 and Q10. Thus, the threshold clamp circuit requires an emitter follower current source transistor element with a base drive of $V_{CS}$. This may be an emitter follower current source transistor element already available in the translator circuit or adjacent integrated circuit portions such as transistor elements Q13 or Q14. Either of the emitter follower output current source transistor elements Q13, Q14 of FIG. 1 perform the functions of both the current source transistor elements Q6 and Q61 of FIG. 3. In the example of FIG. 3, either of the transistor elements Q13, Q14 performs the functions of both the first and second current source transistor elements discussed above with reference to FIG. 1. Similarly the current source voltage level $V_{CS}$ applied at the input clamp circuit may be derived from the base nodes of existing current sink current source transistor elements.

Figure 5:
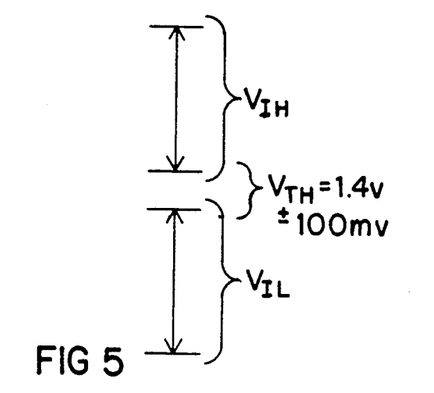
FIG. 5 is a simplified diagrammatic graph illustrating the improved an expanded noise margins tolerated by the translator circuit of the invention.

The improved noise margins for the logic high and low input signal potential levels $V_{TH}$, $V_{IL}$ tolerated by the circuits of FIGS. 3 and 4 are illustrated in FIG. 5.

While the invention has been described with reference to particular example embodiments it is intended to cover all modifications and equivalents within the scope of the following claims.

I claim:

1. A TTL to ECL/CML translator circuit having an ECL base differential gate operatively coupled between relatively high and low potential power rails $V_{CC}$, $V_{EE}$ comprising:

an input transistor element and an input clamp circuit means coupled between a base node of the input transistor element and the low potential power rail $V_{EE}$ for receiving TTL input signals and applying logic high and low signal potential levels $V_{IH}$, $V_{IL}$, referenced to the low potential power rail $V_{EE}$, at the base node of the input transistor element;

a reference transistor element and a threshold clamp circuit means for applying a threshold signal voltage level $V_{TH}$ at a base node of the reference transistor element;

a band-gap bias generator generating a temperature compensated current source voltage level $V_{CS}$ referenced to the low potential level power rail $V_{EE}$;

said threshold clamp circuit means being operatively coupled between the band-gap bias generator and the base node of the reference transistor element for applying a temperature compensated threshold signal voltage level $V_{TH}$, referenced to the temperature compensated current source voltage level $V_{CS}$, at the base node of the reference transistor element, said threshold signal voltage level $V_{TH}$ thereby also being referenced to the low potential level power rail $V_{EE}$.

2. The TTL to ECL/CML translator circuit of claim 1 wherein the temperature compensated threshold signal voltage level $V_{TH}$ applied at the base node of the reference transistor element is selected to be substantially intermediate between the logic high and low signal potential levels $V_{TH}$, $V_{IL}$ at the base node of the input transistor element and wherein the threshold clamp circuit means comprises first voltage level shifting circuit means having voltage level shift components selected to apply the temperature compensated current source voltage level $V_{CS}$ substantially as the threshold voltage level $V_{TH} = V_{CS}$ at the base node of the reference transistor element.

3. The TTL to ECL/CML translator circuit of claim 1 wherein the input clamp circuit means is also operatively coupled between the band-gap bias generator and the base node of the input transistor element for applying a temperature compensated logic high signal potential level $V_{TH}$, referenced to the temperature compensated current source voltage level $V_{CS}$, at the base node of the input transistor element.

4. The TTL to ECL/CML translator circuit of claim 3 wherein the translator circuit ECL base differential gate comprises a first current source transistor element and first tail resistor coupled between a common emitter node of the input and reference transistor elements and the low potential power rail, wherein the threshold clamp circuit means comprises a second current source transistor element and second tail resistor coupled between the high and low potential power rails, wherein the input clamp circuit means comprises a third current source transistor element and third tail resistor coupled between the high and low potential power rails, said respective first, second and third current source transistor elements having respective base nodes coupled to the temperature compensated current source voltage level $V_{CS}$, said threshold clamp circuit means comprising first level shifting circuit means coupled between the emitter node of the second current source transistor element and the base node of the reference transistor element, said input clamp circuit means comprising second level shifting circuit means coupled between the emitter node of the third current source transistor element and the base node of the input transistor element, said first and second level shifting circuit means comprising voltage level shift components selected to maintain substantially the same potential difference $V_{IH} - V_{TH}$ between the base nodes of the input and reference transistor elements over a desired operating temperature range of the translator circuit when a logic high signal potential level $V_{IH}$ is applied at the base node of the input transistor element.

5. The TTL to ECL/CML translator circuit of claim 4 wherein the threshold clamp circuit means first level shifting circuit means comprises voltage level shift components selected to apply the temperature compensated current source voltage level $V_{CS}$ substantially as the threshold voltage level $V_{TH}=V_{CS}$ at the base node of the reference transistor element.

6. The TTL to ECL/CML translator circuit of claim 4 wherein the threshold clamp circuit means and base node of the reference transistor element are coupled to the high potential level power rail $V_{CC}$ through a current sourcing resistor element (R5), said current sourcing resistor element (R5) and the components of the threshold clamp circuit means (Q61, Q7, SD2) being selected so that the current $I_{Q61}$ through the emitter of the second current sourcing transistor element (Q61) is substantially greater than the current $I_{R5}$ through the current sourcing resistor element (R5):

$$I_{Q61} >> I_{R5}$$

7. The TTL to ECL/CML translator circuit of claim 5 wherein the first and second level shifting circuit means comprise respective diode stack circuit means providing diode voltage level shifts selected to maintain over a desired operating temperature range a base voltage differential $V_{IH}-V_{TH}$ between the base nodes of the input and reference transistor elements of at least approximately $3V_T$ where $V_T$ is the band-gap voltage.

8. A TTL to ECL/CML translator circuit having an ECL base differential gate operatively coupled between relatively high and low potential power rails $V_{CC}$, $V_{EE}$ comprising:
an input transistor element and an input clamp circuit means coupled between a base node of the input transistor element and the low potential power rail $V_{EE}$ for receiving TTL input signals and applying logic high and low potential levels $V_{IH}$, $V_{IL}$, referenced to the low potential power rail $V_{EE}$, at the base node of the input transistor element;
a reference transistor element and a threshold clamp circuit means for applying a threshold signal voltage level $V_{TH}$ at a base node of the reference transistor element;
a first current sink coupled between a common emitter node of the input and reference transistor elements and the low potential power rail, said first current sink having a first current source transistor element, first tail resistor element coupled to an emitter node of the first current source transistor element, and a temperature compensated current source voltage supply coupled to a base node of the first current source transistor element and supplying a temperature compensated current source voltage level $V_{CS}$ referenced to the low potential power rail $V_{EE}$;
said threshold clamp circuit means being operatively coupled between the temperature compensated current source voltage supply voltage level $V_{CS}$ and the base node of the reference transistor element for applying a temperature compensated threshold voltage signal level $V_{TH}$, referenced to the temperature compensated current source voltage level $V_{CS}$, at the base node of the reference transistor element, said threshold signal voltage level $V_{TH}$ thereby also being referenced to the low potential level power rail $V_{EE}$.

9. The TTL to ECL/CML translator circuit of claim 8 wherein the threshold clamp circuit means comprises first voltage level shifting circuit means having voltage level shift components selected to apply the temperature compensated current source voltage level $V_{CS}$ substantially as the threshold voltage level $V_{TH}=V_{CS}$ at the base node of the reference transistor element.

10. The TTL to ECL/CML translator circuit of claim 8 wherein the threshold clamp circuit means comprises a second current sink having a second current source transistor element and second tail resistor element coupled between the high and low potential power rails $V_{CC}$, $V_{EE}$, said second current source transistor element having a base node operatively coupled to the temperature compensated current source voltage level $V_{CS}$, and first voltage level shifting circuit means coupled between an emitter node of the second current source transistor element and the base node of the reference transistor element.

11. The TTL to ECL/CML translator circuit of claim 10 wherein the first voltage level shifting circuit comprises a diode stack circuit means with a base collector shorted (BCS) transistor element and a Schottky diode transistor element coupled in series.

12. The TTL to ECL/CML translator circuit of claim 10 wherein the first and second current source transistor elements are coupled through the respective first and second tail resistors to the low potential power rail $V_{EE}$, wherein a current sourcing resistor element (R5) couples the threshold clamp circuit and base node of the reference transistor element to the relatively high potential reference level $V_{CC}$, and wherein the current sourcing resistor element (R5) and the components of the threshold clamp circuit means (Q61, Q7, SD2) are selected so that the current $I_{Q61}$ from the emitter of the second current sourcing transistor element (Q61) is substantially greater than the current $I_{R5}$ through the current sourcing resistor element R5:

$$I_{Q61} >> I_{R5}.$$

13. The TTL to ECL/CML transistor circuit of claim 12 wherein:

$$I_{Q61}/I_{R5} \geq 10.$$

14. The TTL to ECL/CML translator circuit of claim 10 wherein said input and reference transistor elements have emitter nodes coupled together in a common emitter coupling, wherein said first current sink is coupled between the common emitter coupling and the low potential power rail $V_{EE}$, said first current sink comprising said first current source transistor element (Q6) and first tail resistor element (R6), said first current source transistor element having a base node coupled to the base node of the second current source transistor element for applying said temperature compensated current source voltage level $V_{CS}$ to the base node of the second current source transistor element (Q61) of the threshold clamp circuit.

15. The TTL to ECL/CML translator circuit of claim 10 wherein the translator circuit ECL base differential gate comprises at least one output taken from a collector node output of one of the input and reference transistor elements (Q4, Q5), at least one emitter follower output buffer transistor element (Q9, Q10) having a base node coupled to said collector node output, and wherein an output current sink is coupled between the emitter node of the emitter follower output buffer transistor element (Q9, Q10) and the low potential level power rail $V_{EE}$, said output current sink comprising an output current source transistor element (Q13, Q14) and an output tail resistor element (R7), said output current source transistor element having a base node coupled to the temperature compensating current source voltage level $V_{CS}$ for applying said temperature compensated current source voltage level $V_{CS}$ to the threshold clamp circuit.

16. The TTL to ECL/CML translator circuit of claim 10 wherein the input clamp circuit means is operatively coupled between the temperature compensated current source voltage supply and the base node of the input transistor element for applying a temperature compensated logic high signal potential level $V_{IH}$, referenced to the temperature compensated current source voltage level $V_{CS}$, at the base node of the input transistor element.

17. The TTL to ECL/CML translator circuit of claim 16 wherein the input clamp circuit means comprises a third current sink having a third current source transistor element coupled to the low potential level power rail $V_{EE}$ through a third tail resistor element, said third current source transistor element having a base node coupled to the temperature compensated current source voltage level $V_{CS}$, and second voltage level shifting circuit means coupled between the emitter node of the third current source transistor element and the base node of the input transistor element.

18. The TTL to ECL/CML translator circuit of claim 17 wherein the translator circuit is part of an integrated circuit comprised of semiconductor material, and wherein the first and second level shifting circuit means comprise voltage level shift components selected to maintain over a desired operating temperature range a base voltage differential $V_{IH}-V_{TH}$ between the base nodes of the input and reference transistor elements when a logic high signal potential level $V_{IH}$ is applied at the base node of the input transistor element of at least approximately 3 $V_T$ where $V_T$ is the band-gap voltage of the semiconductor material.

19. A TTL to ECL/CML translator circuit having an ECL base differential gate operatively coupled between relatively high and low potential power rails $V_{CC}$, $V_{EE}$ comprising:
an input transistor element (Q4);

an input clamp circuit (Q21, Q3, Q2, SD1) coupled between a base node of the input transistor element (Q4) and the low potential power rail $V_{EE}$ for receiving TTL input signals and applying at the base node of the input transistor element logic high and low potential levels $V_{IH}$, $V_{IL}$, referenced to the low potential power rail $V_{EE}$;

a reference transistor element (Q5);

a threshold clamp circuit (Q61, Q7, SD2) coupled between a base node of the reference transistor element (Q5) and the low potential power rail $V_{EE}$ for applying at the base node of the reference transistor element a threshold signal voltage level $V_{TH}$ referenced to the low potential power rail $V_{EE}$;

at least one current sink having a first current source transistor element, a first tail resistor element coupled to an emitter node of the first current source transistor element, and a temperature compensated current source voltage supply coupled to a base node of the first current source transistor element and supplying a temperature compensated current source voltage level $V_{CS}$ referenced to the low potential power rail $V_{EE}$;

said threshold clamp circuit (Q61, Q7, SD2) being operatively coupled between the temperature compensated current source voltage level $V_{CS}$ and the base node of the reference transistor element (Q5) for applying a temperature compensated threshold voltage signal level $V_{TH}$ referenced to the temperature compensated current source voltage level $V_{CS}$ at the base node of the reference transistor element, said threshold voltage signal level $V_{TH}$ thereby being referenced to the low potential power rail $V_{EE}$ through said temperature compensated current source voltage level $V_{CS}$;

said input clamp circuit (Q21, Q3, Q2) being coupled between the temperature compensated current source voltage level $V_{CS}$ and the base node of the input transistor element (Q4) for applying at the base node of the input transistor element a temperature compensated logic high signal potential level $V_{IH}$ referenced to the temperature compensated current source voltage level $V_S$, said logic high signal potential level $V_{IH}$ thereby also being referenced to the low potential power rail $V_{EE}$ through said temperature compensated current source voltage level $V_{CS}$.

* * * * *